United States Patent

[11] 3,579,115

[72] Inventors Nikolai Goncharoff
Roselle;
Kamil Y. Jabbar, River Grove, Ill.
[21] Appl. No. 798,292
[22] Filed Feb. 11, 1969
[45] Patented May 18, 1971
[73] Assignee Motorola, Inc.
Franklin Park, Ill.

[54] ELECTRONICALLY TUNED OSCILLATOR
11 Claims, 1 Drawing Fig.

[52] U.S. Cl. 325/438, 325/453, 331/36
[51] Int. Cl. H04b 1/26
[50] Field of Search 325/430, 438, 452, 453, 468, 335, 457, 459; 334/11, 14, 15; 331/4, 36 (C), 177 (V); 332/30 (V)

[56] References Cited
UNITED STATES PATENTS
3,354,397 11/1967 Wittig 325/453X

*Primary Examiner*—Robert L. Griffin
*Assistant Examiner*—R. S. Bell
*Attorney*—Mueller and Aichele

ABSTRACT: An electronically tuned oscillator for use as a local oscillator in an AM radio receiver includes a transistor as the active component, with the emitter-base circuit of the transistor being supplied with signals obtained from two taps on the coil of the tank circuit of the oscillator. The tank circuit is tuned by use of a varactor or hyperabrupt diode supplied with tuning voltages obtained from a potentiometer connected across a DC source. The collector of the transistor is connected through a resistor to ground potential, and the taps are located to cause the reflected capacitance from the transistor across the tuning diode to be minimized, while at the same time providing sufficient energy to drive the transistor. The output of the transistor then is AC-coupled to a transistor amplifier stage which is AC-coupled to an emitter follower, the output of which supplies the oscillator signals to a mixer circuit in the radio receiver.

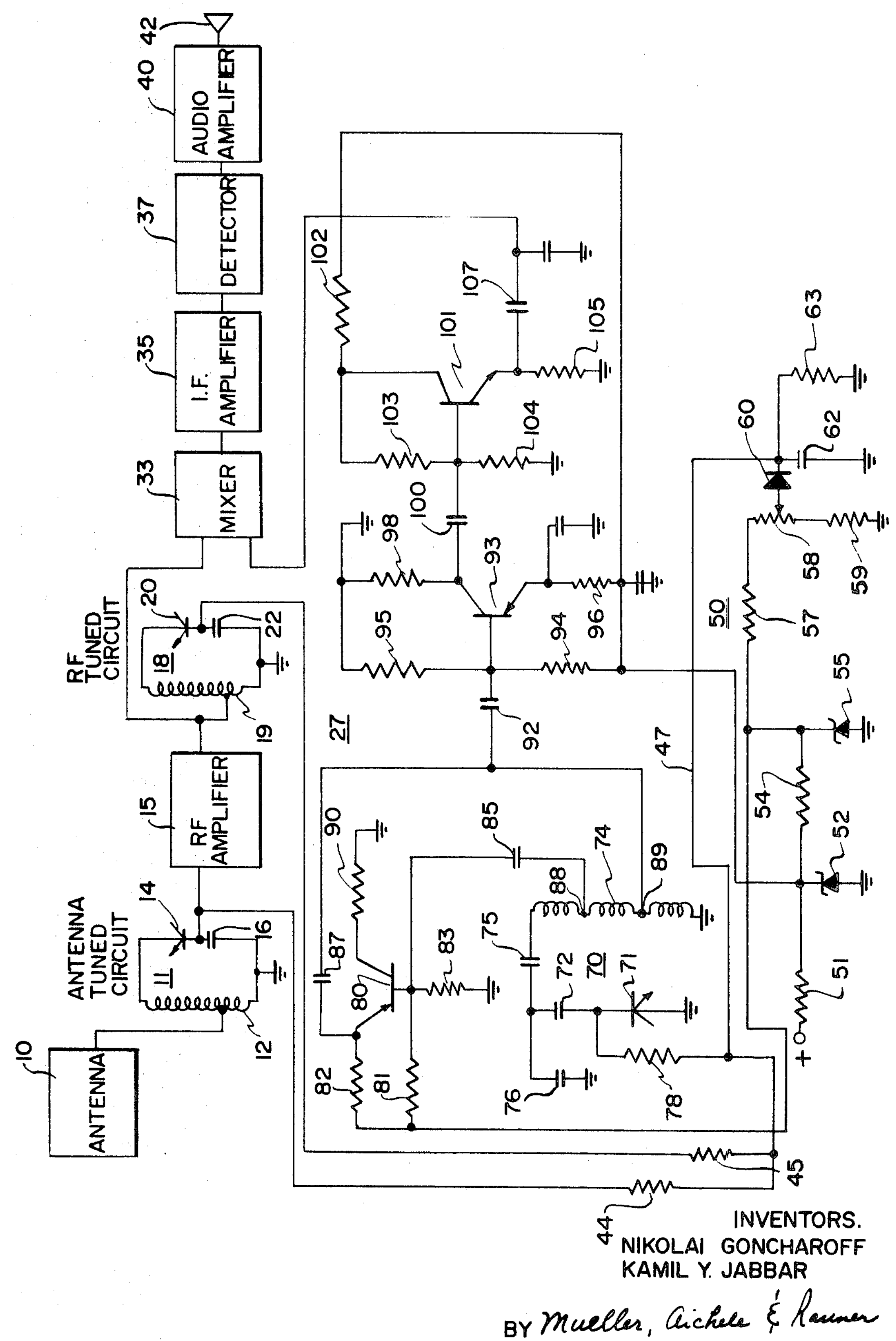
INVENTORS.
NIKOLAI GONCHAROFF
KAMIL Y. JABBAR
BY Mueller, Aichele & Rauner
ATTORNEYS.

ELECTRONICALLY TUNED OSCILLATOR

BACKGROUND OF THE INVENTION

Electronic tuning of radio receivers, especially automobile radio receivers, is attractive since it makes possible the location of tuning stations remote from the radio receiver itself. As a consequence, remote tuning stations may be positioned in the arm rest on the doors of the front and back seats of an automobile or in other locations so that the radio can be tuned from any desired location within the automobile.

In using electronically tuned oscillators in such radio receivers, however, a tracking problem may exist due to pulling of the oscillator frequency upon receipt of strong signals by the receiver. In addition, it has been found that the tuning diode in the oscillator tank circuit is affected by the reflected capacitance from the oscillator transistor which tends to reduce the tuning range and by the amount of current drawn by the oscillator transistor which may be high enough to cause a voltage drop across the tuning diode sufficient to change its capacitance and, thus, detune the tank circuit.

SUMMARY OF THE INVENTION

It is an object of this invention to provide an improved electronically tuned oscillator circuit.

It is an additional object of this invention to isolate the tank circuit of an electronically tuned oscillator from pulling effects of strong signals received in a radio receiver of which the oscillator is a part.

It is another object of this invention to provide a stable electronically tuned oscillator circuit by minimizing the capacitance reflected across the tuning diode from the active components of the oscillator and to limit the current drawn from the tank circuit to a minimum amount.

In a preferred embodiment of this invention, a local oscillator includes a transistor having collector, base and emitter electrodes, with a tuned circuit including a voltage variable capacitance as the tuning element. The tuned circuit is connected in the base-emitter circuit of the transistor, while the collector of the transistor is connected to a constant load. The output of the oscillator then is connected through an isolating and amplifying circuit to the remainder of the radio receiver with which oscillator is used, and a source of DC biasing potential is supplied to the voltage variable capacitor for tuning the oscillator circuit.

BRIEF DESCRIPTION OF THE DRAWING

The single FIGURE of the drawing is a schematic diagram, partially in block form, of a preferred embodiment of the invention.

DETAILED DESCRIPTION

Referring now to the drawing, there is shown a wave signal radio receiver with input signals appearing at an antenna 10 which is connected to an impedance matching point on the primary winding 12 of an antenna tuned circuit 11, including a blocking capacitor 16 and a voltage variable capacitor or reactance device 14. The voltage variable capacitor 14 is a two-terminal PN junction semiconductor device such as a varactor or hyperabrupt diode exhibiting a change in capacitance which is proportional to a change in the direct current bias voltage applied across the device. By varying the direct current bias across the voltage variable capacitor 14, the antenna 10 can be tuned through a predetermined frequency range.

The received signal then is coupled to an RF amplifier 15 where it is amplified and connected to an impedance matching point on the primary winding 19 of an RF tuned circuit 18 which includes a second voltage variable capacitor 20 and a blocking capacitor 22. The signals from the RF amplifier 15 are supplied as one input to a mixer circuit 33 where they are heterodyned with signals obtained from the output of a local oscillator 27.

An intermediate frequency signal obtained from the output of the mixer 33 is amplified in an IF amplifier stage 35, with the signal from the IF amplifier 35 being detected by a detector 37 and being coupled to an audio amplifier 40, the output of which drives a speaker 42.

The tuned circuits 11 and 18 are similar to one another and both are tuned in a similar manner by varying the DC bias potential applied to the cathodes of the voltage variable capacitors 14 and 20 through a pair of isolating resistors 44 and 45 from a lead 47, which is connected to the output of a stabilized DC supply circuit 50.

The supply circuit 50 operates from a source of unregulated B+, which is supplied through a first resistor 51 and a Zener diode 52 to ground to establish a first regulated output potential across the Zener diode 52. This output, in turn, is supplied through a resistor 54 and a second Zener diode 55 connected between the diode 52 and ground. The Zener diode 55 provides a regulated or stabilized potential for a voltage divider connected across it with the voltage divider including three resistors 57, 58 and 59.

The resistor 58 is a potentiometer, the tap of which is connected through a silicon diode 60 to the conductor 47; and the characteristics of the diode 60 are chosen to provide temperature compensation for variations in the operation of the voltage variable capacitor diodes 14 and 20 which occur due to changes in the ambient temperature. In order to provide further stabilization for the control voltage obtained from the tap of the potentiometer 58, a filter circuit including a parallel-connected capacitor 62 and resistor 63 is provided between the cathode of the diode 60 and ground. This circuit operates to eliminate ripple components which might appear in the output voltage obtained from the potentiometer 58.

In order to provide an all electronically tuned radio receiver, the oscillator 27 also includes a tank circuit 70 having a voltage variable capacitor 71 and a blocking capacitor 72 connected across a three-sectioned coil 74. In addition, another capacitor 75 is connected between the junction of the capacitor 72 and one end of the coil 74, and a capacitor 76 is connected across the series combination of the voltage variable capacitor 71 and the blocking capacitor 72. The tuned circuit 70, with the exception of the capacitors 75 and 76, is similar to the tuned circuits 11 and 18 and is operated in the same manner, with the DC bias potential for the tuned circuit 70 being obtained from the output of the potentiometer 58 through the diode 60 and an isolating resistor 78. The capacitors 75 and 76 are necessary for some applications in order to provide for additional distributed capacitance and in order to cause the tuned circuit 70 to properly track the tuning of the circuits 11 and 18.

The active element of the oscillator 27 is a PNP transistor 80 which is supplied with DC operating potentials obtained across the Zener diode 55 and applied to the base and emitter through a pair of resistors 81 and 82, respectively, with the junction between the base of the transistor 80 and the resistor 81 being connected through a resistor 83 to ground.

In the operation of a tuned circuit using a voltage variable capacitor in the form of a varactor diode or a hyperabrupt diode, it is desirable to limit the AC voltages across the diode to as low an amount as possible, since at high AC signal levels, the diode tends to rectify some of the signals. This causes a change in the bias potential appearing across the diode, resulting in detuning of the circuit which, in the case of an oscillator circuit such as the tuned circuit 70 which must track a pair of tuned circuits 11 and 18, could cause substantial degradation in the performance of the radio receiver.

When a resonant circuit is operated at resonance, it attains the characteristics of a pure resistance in the circuits of which it is a part. Thus, if such a circuit as the resonant circuit 70 is placed in the collector circuit of a transistor, the substantial current drawn by the collector of the transistor causes a corresponding substantial voltage drop to appear across the resonant circuit. This voltage drop is reflected across the voltage variable capacitor 71; and if it is a high enough voltage drop, detuning of the tank circuit can take place.

In order to limit to as great an extent as possible the current across the tank circuit at resonance, the inductor 74 is provided with two taps 88 and 89, one of which (88) is connected through a coupling capacitor 85 to the base of the transistor 80 and the other of which (89) is connected through a feedback capacitor 87 to the emitter of the transistor 80. Since the base current is substantially lower than the collector current of a transistor for any given operating level of the transistor, the current drawn by the transistor and applied across the resonant circuit 70 is substantially lower than if the resonant circuit 70 were placed in the collector circuit of the transistor 80. Thus, the voltage drop across the circuit 70 also is lower than if the resonant circuit were placed in the collector circuit of the transistor.

When the base-emitter circuit of a transistor is connected across a tank circuit such as the tank circuit 70, the relatively high circuit capacitance of the base circuit is connected substantially in parallel with the tuning capacitor 71 of the tuning circuit. As a consequence, the greater the circuit capacitance of the transistor, the more limited is the tuning range possible from a given voltage variable tuning capacitor 71 which may be obtained. Thus, it is desirable to reduce the circuit capacitance reflected from the transistor 80 to the resonant circuit 70 to as great an extent as possible; and this is accomplished by use of the two taps 88 and 89 connecting the capacitors 85 and 87 to the base and emitter, respectively, of the transistor 80. Since the output from the tank circuit 70 is obtained from only a portion of the inductor 74, the reflected capacitance of the transistor 80 also is applied only across a small portion of the inductor 74, thereby resulting in a reduction of the reflected capacitance connected across the voltage variable capacitor diode 71. The taps 88 and 89 are spaced just far enough apart in order to permit sufficient signal strength to be derived from the tuned circuit 70 to drive the transistor 80. This permits oscillation of the circuit while permitting as full a range of tuning frequencies as possible from a given voltage variable capacitor diode 71.

In order to prevent a fluctuating load from causing corresponding fluctuations in the DC signals reflected by the transistor 80 across the voltage variable capacitor 71, the collector of the transistor 80 is connected through a resistor 90 to ground. This causes a constant DC load to be coupled to the transistor 80; so that variations in the load, such as would be obtained if a transformer output coupling were used, do not cause degradation of the tuning of the tank circuit 70.

The low-level signals obtained from the emitter of the transistor 80 are applied through a coupling capacitor 92 to the base of a transistor amplifier 93, the emitter and base of which are supplied with DC operating potentials from a voltage divider consisting of a pair of resistors 94 and 95 connected across the Zener diode 52. Potential is applied to the emitter of the transistor 93 through a coupling resistor 96 connected to the junction of the Zener diode 52 and resistor 94, with the collector of the transistor 93 being coupled through a resistor 98 to ground potential.

The amplified output signals obtained from the collector of the transistor 93 are further supplied through a coupling capacitor 100 to the base of an NPN emitter-follower transistor 101. Operating potentials for the base and collector of the transistor 101 also are obtained from a voltage divider consisting of three resistors, 102, 103 and 104 connected across the Zener diode 52, with the emitter of the transistor 101 being connected through an emitter resistor 105 to ground and through a coupling capacitor 107 to the second input of the mixer 33.

The transistor amplifier 93 is necessary to obtain a useful voltage level from the low-level output of the oscillator transistor 80. In addition, the emitter-follower transistor 101 is used to provide additional isolation of the oscillator circuit from the mixer 33. This is done in order to prevent pulling of the oscillator signal by the coupling back of DC signals from the mixer 33 to the tank circuit 70 due to strong signals received on the antenna 10 and applied to the other input of the mixer 33. If the isolation provided by the amplifier 93 and the emitter-follower 101 with their respective coupling circuits were not employed, detuning of the oscillator tank circuit 70 could occur due to variations in the reflected DC voltage level applied to the transistor 80 from the mixer 33.

An electronically tuned oscillator circuit made in accordance with this invention minimizes the tracking problems which exist in the use of such tuned circuits in conjunction with other electronically tuned circuits in a radio receiver. In addition, the circuit is temperature and voltage stabilized and provides frequency stability and eliminates oscillator pulling action on strong signals received by the receiver. The advantages of remote tuning also exist, resulting in a size reduction of the tuner by the elimination of mechanical tuning parts.

We claim:

1. In an electronically tuned AM radio receiver, an oscillator circuit including in combination:

- a transistor having collector, base, and emitter electrodes;
- a tank circuit, including a voltage variable capacitor as the tuning element therein, for controlling the oscillator frequency;
- means for connecting the tank circuit in the base-emitter circuit of the transistor;
- means for supplying a tuning voltage to the voltage variable capacitor;
- means for connecting the collector of the transistor to a constant DC load;
- means for isolating the output from the transistor and for supplying said output to the radio receiver; and
- means coupling the emitter of the transistor to the input of the isolating means.

2. The combination according to claim 1 wherein the constant load connected to the collector of the transistor is a fixed resistance.

3. The combination according to claim 2 wherein the fixed resistance is connected between the collector of the transistor and a source of reference potential.

4. The combination according to claim 1 wherein the voltage variable capacitor is a reverse-biased hyperabrupt diode device, the capacitance of which varies in accordance with the DC reverse bias voltage applied thereto, and the tuning voltage is a DC reverse bias voltage.

5. The combination according to claim 1 wherein the isolating means includes an AC-coupled amplifier supplying signals to an AC-coupled emitter follower, the output of which is supplied to a mixer circuit in the radio receiver.

6. The combination according to claim 5 wherein the amplifier and emitter follower are a transistor amplifier and emitter follower.

7. An electronically tuned AM radio receiver having a local oscillator including in combination:

- a transistor having base, emitter, and collector electrodes;
- a tank circuit for the oscillator including an inductor and a voltage variable tuning capacitor;
- means for supplying variable DC tuning voltage to the voltage variable capacitor in order to change the resonant frequency of the tank circuit, thereby changing the frequency of the output of the oscillator;
- means for connecting the emitter-base circuit of the transistor to the tank circuit;
- means for connecting the collector of the transistor to a constant DC load; and
- means for isolating and amplifying the output of the transistor and for supplying the isolated and amplified output to the radio receiver circuit.

8. The combination according to claim 7 wherein the base of the transistor is connected to one tap on the inductor in the tank circuit and the emitter of the transistor is connected to another tap on the inductor of the tank circuit, the taps being located far enough apart in order to provide sufficient energy to drive the transistor while minimizing the reflected capacitance across the tank circuit from the transistor.

9. The combination according to claim 8 wherein the constant load connected to the collector of the transistor includes a resistor connected between the collector electrode and a source of reference potential.

10. The combination according to claim 9 wherein the isolating and amplifying means includes an AC-coupled transistor amplifier connected to the output of the first-mentioned transistor, with the output of the transistor amplifier being AC-coupled to an emitter-follower transistor, the output of which is supplied to a mixer in the radio receiver.

11. The combination according to claim 10 wherein the output of the first-mentioned oscillator transistor is AC-coupled from its emitter to the amplifier transistor.